United States Patent [19]
Chou et al.

[11] Patent Number: 5,952,686
[45] Date of Patent: Sep. 14, 1999

[54] SALIENT INTEGRATION MODE ACTIVE PIXEL SENSOR

[75] Inventors: Eric Y. Chou, Fremont; Kit M. Cham, Cupertino; Jane M. J. Lin, San Jose, all of Calif.

[73] Assignee: Hewlett-Packard Company, Palo Alto, Calif.

[21] Appl. No.: 08/984,457

[22] Filed: Dec. 3, 1997

[51] Int. Cl.[6] .............................. H01L 27/14; H01L 31/00
[52] U.S. Cl. ........................... 257/292; 257/448; 250/206
[58] Field of Search .................................... 257/292, 461, 257/462, 443, 448; 250/206, 215

[56] References Cited

U.S. PATENT DOCUMENTS

| | | | |
|---|---|---|---|
| 5,307,169 | 4/1994 | Nagasaki et al. | 257/292 |
| 5,408,113 | 4/1995 | Kanno et al. | 257/292 |
| 5,587,596 | 12/1996 | Chi et al. | 257/462 |
| 5,608,243 | 3/1997 | Chi et al. | 257/462 |

*Primary Examiner*—Donald L. Monin, Jr.
*Attorney, Agent, or Firm*—Brian R. Short

[57] ABSTRACT

A salient integration mode active pixel sensor. The active pixel sensor includes an amplify/compare transistor which has a threshold voltage. The amplify/compare transistor couples an input of the amplify/compare transistor to an output of the amplify/compare transistor when the input of the amplify/compare transistor exceeds the threshold voltage. A photo-diode generates a signal voltage which has a voltage level dependent upon the intensity of light received by the photo-diode. The signal voltage is coupled to the input of the amplify/compare transistor. A reset element couples a reset line to the photo-diode and discharges the photo-diode when the reset line is active. A coupling capacitor for couples a select line to the input of the amplify/compare transistor. The select line causes the input to the amplify/compare transistor to exceed the threshold voltage and thereby couple the signal voltage to the output of the amplify/compare transistor. The amplify/compare transistor can be an N-type MOSFET and the reset transistor can be an N-type MOSFET. Further, a back gate of the amplify/compare transistor is generally connected to a circuit ground.

17 Claims, 13 Drawing Sheets

SALIENT INTEGRATION MODE ACTIVE PIXEL SENSOR

FIELD OF INVENTION

This invention relates generally to an active pixel sensor. In particular, it relates to an active pixel sensor which includes transistors operating in a salient integration mode.

BACKGROUND

An electronic camera generally converts an optical image into a set of electronic signals. The electronic signals may represent intensities of light received by the camera. The electronic camera typically includes an array of image sensors which detect the intensity of light received by the camera. The image sensors typically generate electronic signals that have amplitudes that are proportionate to the intensity of the light received by the sensors. The electronic signals can be sampled and digitized to allow image processing.

Integration of the image sensors with signal processing modules is important because integration enables miniaturization and enhancement of imaging systems. Integration of image sensors along with analog and digital signal processing modules allows electronic camera systems to be compact, low cost and dissipate low amounts of power. However, the degree of integration is dependent upon the miniaturization of the image sensors.

Historically, image sensors have predominantly been charged coupled devices (CCDs). CCDs are relatively small and can provide a high-fill factor. However, CCDs are very difficult to integrate with digital and analog signal processing modules. Further, CCDs dissipate large amounts of power and can suffer from image smearing problems.

An alternative to CCD sensors are active pixel sensors. Several types of prior art active pixel sensor structures presently exist. However, each of the prior art active pixel sensor structures include features which limit the desirability of the specific sensor structure.

FIG. 1 shows a prior art active pixel sensor structure which requires four transistors Q1, Q2, Q3, Q4, a floating diode FD and a MOS capacitor CM1. Due to the large number of circuit elements, this active pixel structure requires a significant amount of integrated circuit area. The RST line of this structure allows the floating diode FD to be discharged. A PG connection includes a polysilicon wire. By adjusting the voltage potential of the PG connection, the MOS capacitor CM1 is created due to depletion of a channel region created under the PG connection. A TX connection is driven to a fixed voltage potential to provide a potential barrier for the MOS capacitor CM1. The depletion region which creates the MOS capacitor CM1 is generated by biasing the PG connection to a high voltage potential (Vdd). The MOS capacitor CM1 will accumulate electrons when exposed to light which excites the electrons. After a period of integration, the electrons accumulated on the MOS capacitor are transferred to the floating diode FD because the MOS capacitor CM1 ceases to exist. A signal voltage is stored across the floating diode FD which is proportional to the intensity of light received by the active pixel sensor. The SEL connection allows the signal voltage across the floating diode to be sampled. As was previously mentioned, the substantial number of electrical components associated with this active pixel sensor require a large amount of integrated circuit area which limits the fill factor of the sensor.

FIG. 2 shows a prior art active pixel sensor structure which requires three transistors Q5, Q6, Q7 and a photo-diode PD1. The photo-diode PD1 collects charge at a rate which is proportional to the intensity of light received by the photo-diode PD1. Capacitance coupled to the node FD accumulates charge as the photo-diode PD1 collects electrons. The active pixel sensor structure shown in FIG. 2 includes fewer transistors than the active pixel sensor structure shown in FIG. 1. Therefore, the active pixel sensor structure shown in FIG. 2 is smaller than the active pixel sensor structure shown in FIG. 1. However, miniaturization of an array of these pixel sensors is limited by the fill factor of the pixel sensors. To improve the fill factor, the number of transistors in each pixel sensor must be further reduced.

FIG. 3 shows a prior art single NPN bipolar transistor active pixel sensor. The size benefits of including only a single transistor within the active pixel sensor are negated by the size requirements for implementing the active pixel sensor. That is, the single transistor is an NPN bipolar transistor which requires an N-well when the active pixel sensor is implemented using a P-doped substrate. Typically, a N-wells are large when implemented using a CMOS fabrication process. Furthermnore, a base node of the NPN bipolar transistor is essentially floating. Therefore, resetting the active pixel sensor at the base node is not very easy. As a result, this active pixel sensor can suffer image lagging.

FIG. 4 shows a prior art passive pixel sensor structure which requires two transistors Q9, Q10 and a photo-diode PD2. The photo-diode PD2 includes a junction capacitance CD. An output of the passive pixel is connected to a bitline which includes a bus capacitance CBUS. The transistor Q10 is turned on when selecting the active pixel sensor. The capacitance of the junction capacitance CD is effectively connected in parallel with a capacitance of a bus CBUS. The fill factor of this pixel sensor is high. However, the signal to noise ratio is not scalable with an increase in the number of pixel sensors within an array of the pixel sensors. A voltage potential created by charge stored on the capacitance of the photo-diode is shared with the capacitance of bus. When the active pixel sensor is selected, the voltage charge collected on the capacitance of the photo-diode is greatly reduced as the charge on the capacitance of the photo-diode is shared with the capacitance of bus. The capacitance of the bus increases as the size of the active pixel sensor array increases. Therefore, the signal to noise ratio of a signal generated by the active pixel sensor is greatly reduced when the active pixel sensor is within a large array of active pixel sensors.

It is desirable to have an active pixel sensor which is physically small and provides a high fill factor. The active pixel sensor would provide low-noise read-out signals, electronic shuttering and anti-blooming. Further, the active pixel sensor could be integrated with image processing circuitry and fabricated using a low-cost CMOS process.

SUMMARY OF THE INVENTION

The present invention provides an active pixel sensor which is compatible with low-cost CMOS fabrication processes. The active pixel sensor is physically small and provides a high-fill factor. The active pixel sensor provides low-noise read-out signals, anti-blooming and electronic shuttering. Further, the active pixel sensor can be integrated with analog and digital processing circuitry.

A first embodiment of this invention includes an active pixel sensor. The active pixel sensor includes an amplify/compare transistor which has a threshold voltage. The amplify/compare transistor couples an input of the amplify/compare transistor to an output of the amplify/compare transistor when the input of the amplify/compare transistor exceeds the threshold voltage. A photo-diode generates a signal voltage which has a voltage level dependent upon the intensity of light received by the photo-diode. The signal voltage is coupled to the input of the amplify/compare transistor. A reset transistor couples a reset line to the photo-diode and discharges the photo-diode when the reset line is active. A coupling capacitor couples a select line to the input of the amplify/compare transistor. The select line causes the input to the amplify/compare transistor to exceed the threshold voltage and thereby couple the signal voltage to the output of the amplify/compare transistor. The threshold voltage is adjusted to enhance the dynamic range of the signal voltage coupled to the output of the amplify/compare transistor. A back gate of the amplify/compare transistor is connected to a P-type substrate which is connected to a circuit ground.

Another embodiment of the invention is similar to the first embodiment, but includes the amplify/compare transistor being an N-type MOSFET and the reset transistor being an N-type MOSFET. Further, the back gate of the amplify/compare transistor is connected to a P-well which is connected to a presettable voltage.

Another embodiment of the invention is similar to the first embodiment, but includes the amplify/compare transistor being an P-type MOSFET and the reset transistor being an N-type MOSFET. Further, a back gate of the amplify/compare transistor is connected to a variable voltage which adjusts the threshold voltage.

Another embodiment of the invention is similar to the first embodiment, but includes the amplify/compare transistor being an P-type MOSFET and the reset transistor being an P-type MOSFET. Further, a back gate of the amplify/compare transistor is connected to a variable voltage which adjusts the threshold voltage.

Other aspects and advantages of the present invention will become apparent from the following detailed description, taken in conjunction with the accompanying drawings, illustrating by way of example the principles of the invention.

DETAILED DESCRIPTION

Figure 1:
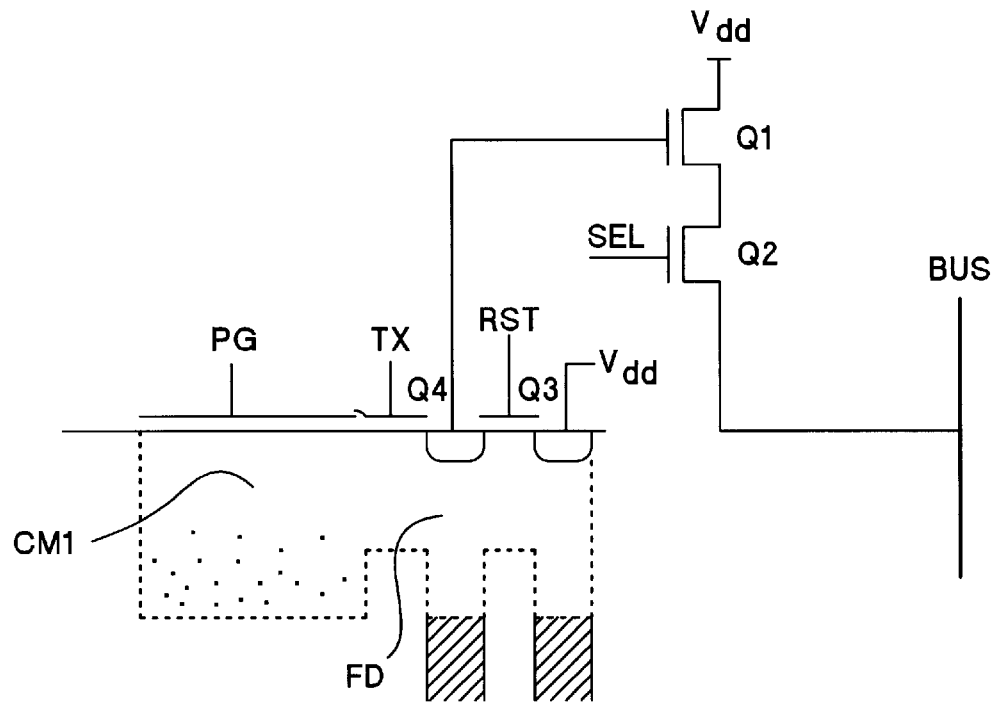
FIG. 1 shows a prior art active pixel sensor structure which includes four transistors.
Figure 2:
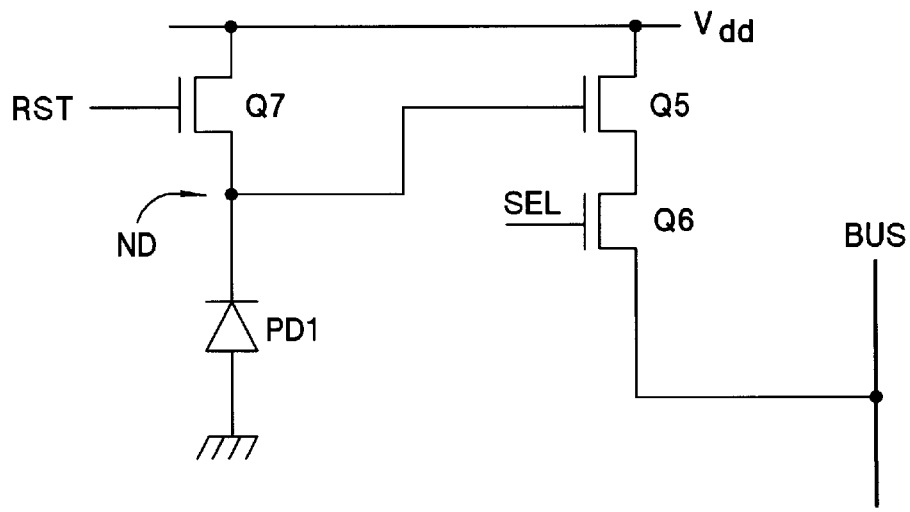
FIG. 2 shows a prior art active pixel sensor structure which includes three transistors.
Figure 3:
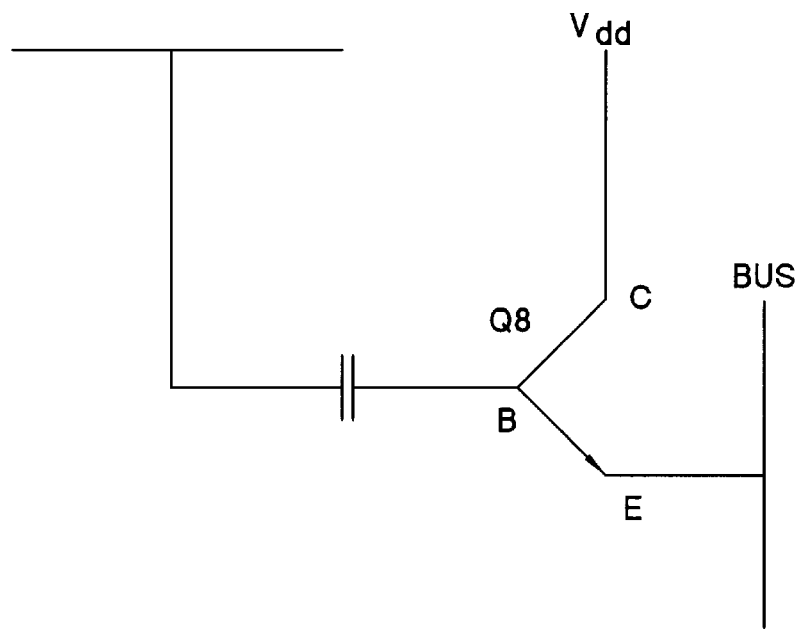
FIG. 3 shows a prior art active pixel sensor structure which includes a single NPN bipolar transistor.
Figure 4:
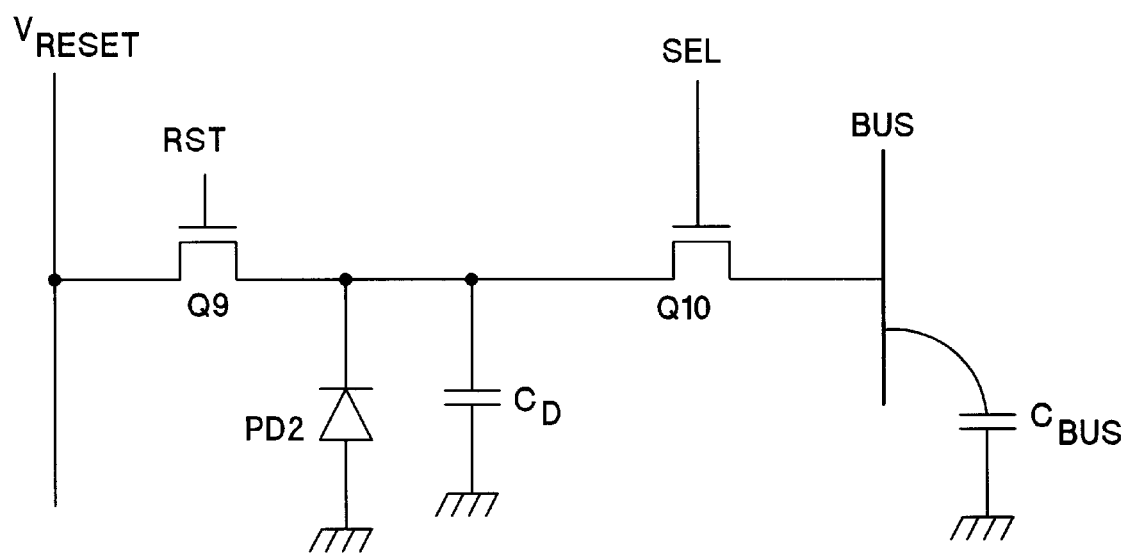
FIG. 4 shows a prior art passive pixel sensor structure which includes two transistors.

As shown in the drawings for purposes of illustration, the invention is embodied in a salient integration mode active pixel sensor. The active pixel sensor provides a small pixel size and a high-fill factor. The active pixel sensor provides low-noise read-out signals, anti-blooming and electronic shuttering. Further, the active pixel sensor can be integrated with analog and digital processing circuitry using a low-cost fabrication process.

Figure 5:
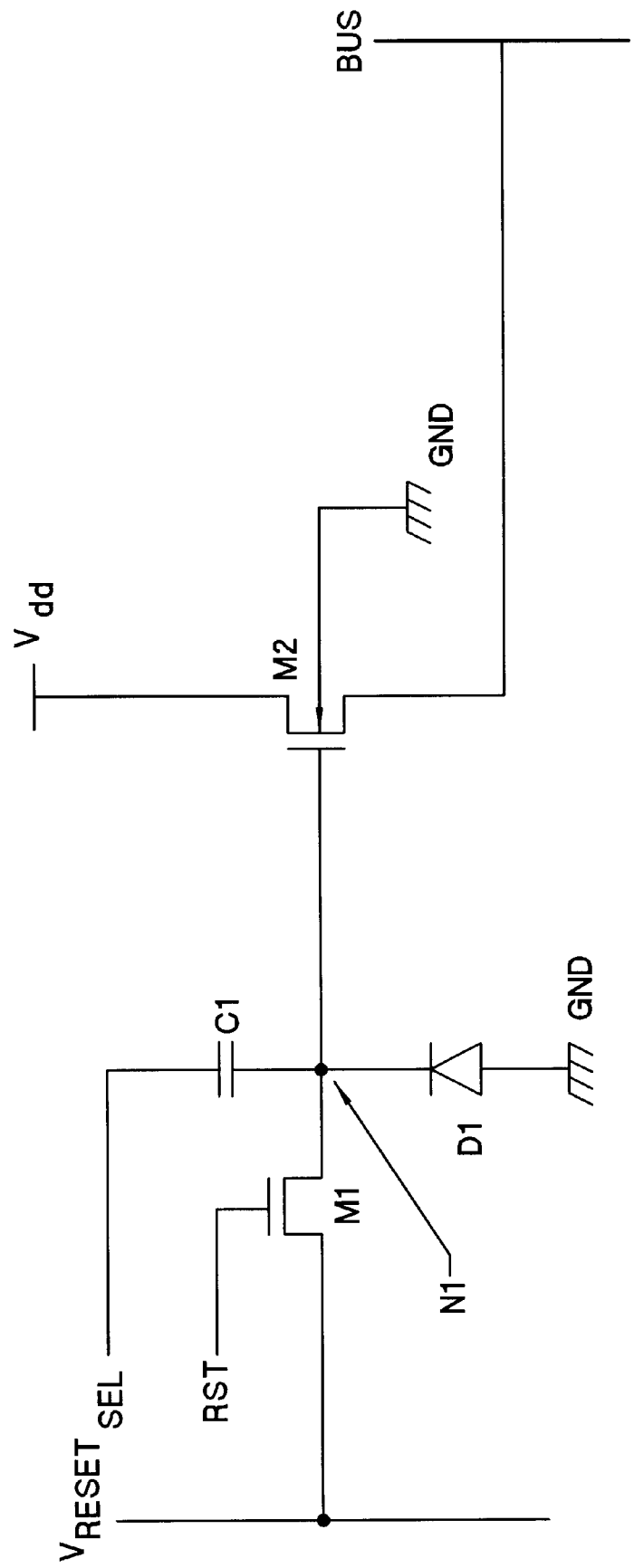
FIG. 5 is a circuit schematic of a first embodiment of the invention.

FIG. 5 is a circuit schematic of a first embodiment of the invention. This embodiment is an active pixel sensor which includes an N-type MOSFET reset transistor M1, an N-type MOSFET amplify/compare transistor M2, a coupling capacitor C1 and a photo-diode D1. The amplify/compare transistor M2 includes a channel implant which includes a high substrate impurity concentration. The channel implant results in the amplify/compare transistor M2 having a threshold voltage which is higher than a typical N-type MOSFET transistor. The input (gate) of the amplify/compare transistor M2 is connected to the cathode of the photo-diode D1. The connection node is designated as signal a node N1 in FIG. 5. Forming channel implants in MOSFET transistors is well known in the art of transistor fabrication.

The circuit schematic of FIG. 5 includes several controlled inputs and a single output. The controlled inputs include Vdd, Vreset, GND, SEL and RST. Vdd is a power supply which generally also powers digital and analog signal processing circuitry associated with the active pixel sensor. GND is a circuit ground. Vreset is a reference voltage which determines the bias of the signal node N1 across the photo-diode D1 when the active pixel sensor is reset. Vreset can also be connected to the power supply voltage Vdd. However, this results in the active pixel sensor requiring a longer amount of time to reset. The SEL input is active when selecting the active pixel sensor for the purpose of sensing the intensity of light being received by the active pixel sensor. The SEL input is a pulsed input which biases the circuit elements of the active pixel sensor for the purpose of coupling a voltage potential across the photo-diode D1 to an output BUS. The RST input resets the active pixel sensor by biasing the signal node N1 and discharging the photo-diode D1.

The pulsed SEL input and the coupling capacitor C1 can be physically realized by fabricating a polysilicon layer over an N-island diffusion layer. Fabrication of a polysilicon layer over an N-island diffusion layer is well known in the art of semiconductor fabrication.

Figure 6:
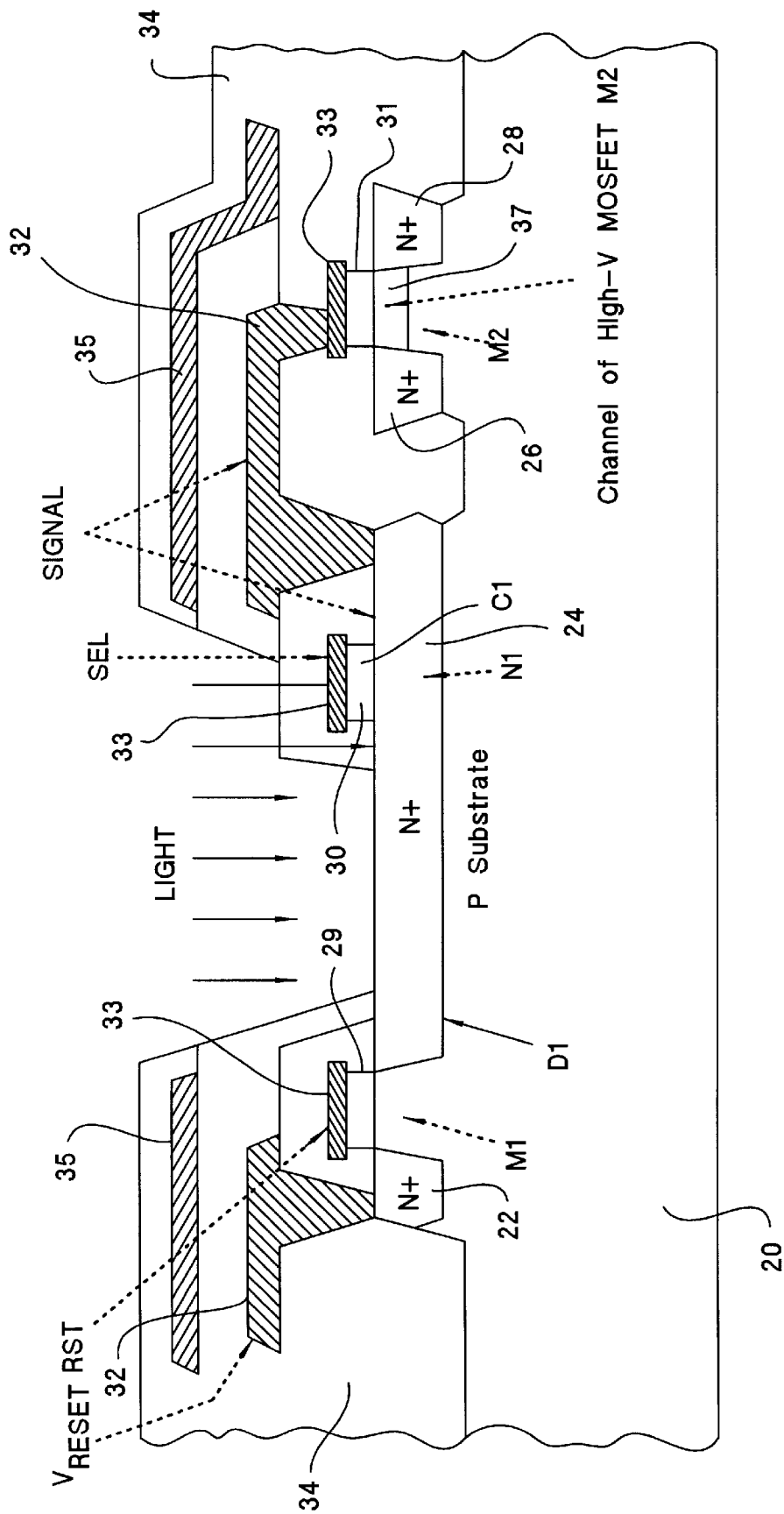
FIG. 6 shows an implementation of the embodiment shown in FIG. 5.

FIG. 6 shows an implementation of the embodiment shown in FIG. 5. This embodiment includes a P-doped substrate 20. The P-doped substrate 20 includes several N-doped diffusion regions 22, 24, 26, 28. The embodiment further includes gate oxide regions 29, 30, 31, a poly-silicon layer 33, a metal layer 32, a photo-resist metal layer 35 and a field oxide region 34.

The reset transistor M1 is formed by the N-doped diffusion region 22, the gate oxide region 29, the P-doped substrate 20 and the N-doped diffusion region 24. The amplify/compare transistor M2 is formed by the N-doped diffusion region 26, the gate oxide region 31, the P-doped substrate 20 and the N-doped diffusion region 28. The amplify/compare transistor M2 further includes a channel implant 37. The photo-diode D1 is formed by the P-doped substrate 20 and the N-doped diffusion region 24. The coupling capacitor is formed by the gate oxide region 30 and the poly-silicon layer 33.

Figure 7:
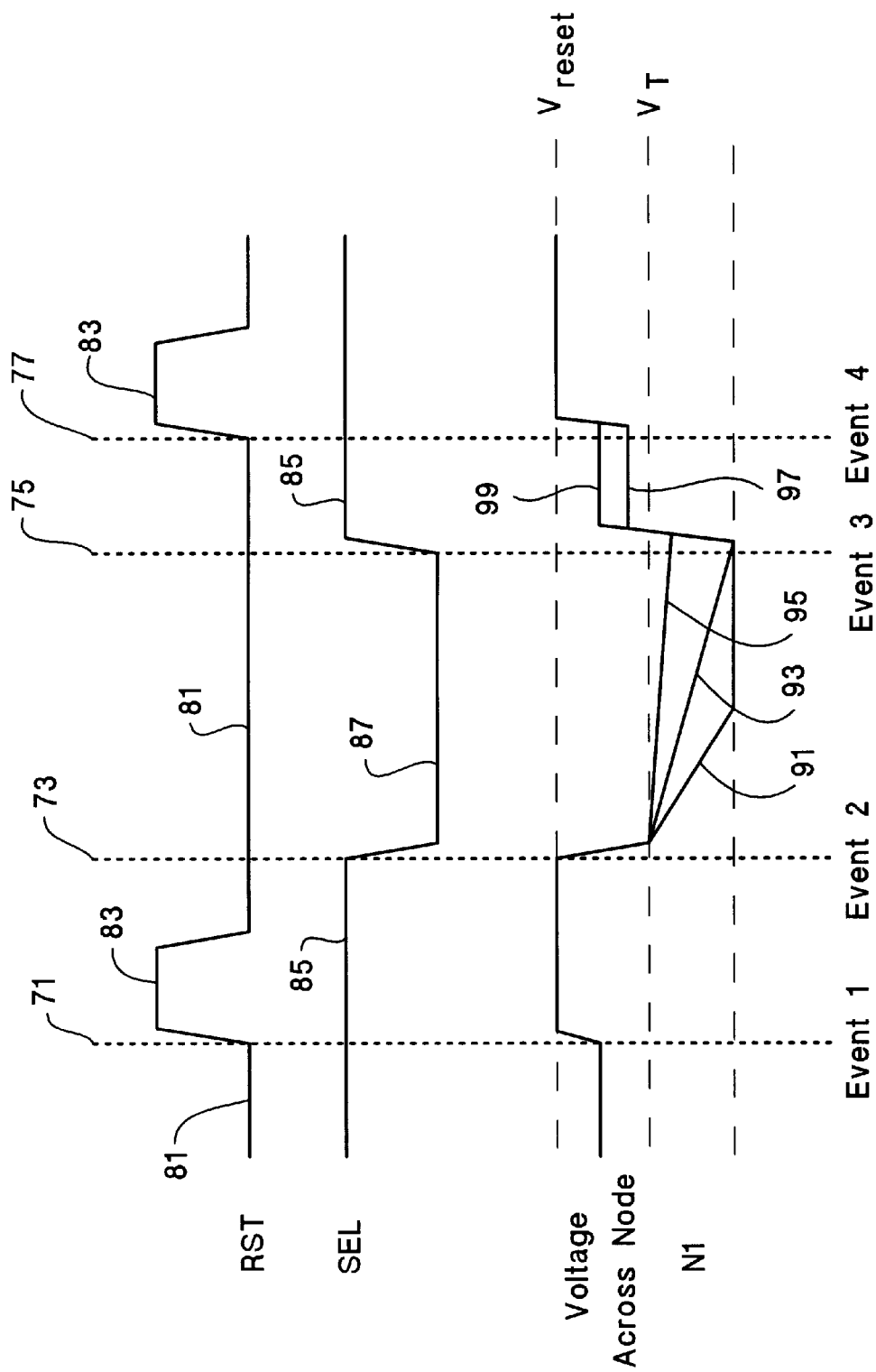
FIG. 7 is a timing diagram of the signals shown in the schematic of FIG. 5 when detecting the intensity of light being received by the active pixel sensor of the invention.

FIG. 7 is a timing diagram of the signals shown in the schematic of FIG. 5 when detecting the intensity of light received by the active pixel sensor of the invention. Detecting the intensity of the light can be sectioned into four major events or steps.

A first event 71 includes the reset line (RST) of the active pixel sensor pulsing from a low reset voltage 81 to a high reset voltage 83. When the reset line (RST) is at the high reset voltage, the reset transistor M1 turns on and conducts current. When the reset transistor M1 conducts current, the signal node N1 is pulled up to the voltage potential of the Vreset input. The voltage potential of the Vreset input is adjustable. However, generally Vreset should be set to a voltage potential of less than the high reset voltage 83 minus the threshold voltage of the reset transistor M1 to reduce the settling time and noise. For example, if the high reset voltage 83 is 5 volts and the threshold of the reset transistor M1 is 0.7 volts, then the voltage potential of the Vreset voltage should be less than 4.3 volts.

A second event 73 includes the voltage potential of the SEL input pulsing from a high select voltage 85 to a low select voltage 87. The RST input is at the low reset voltage 81 for the duration of time the SEL input remains at the low select voltage 87. The SEL input is coupled to the signal node N1 through the coupling capacitor C1. The rapid change in voltage across the coupling capacitor C1 pulls charge away from the coupling capacitor C1. The voltage potential of the signal node N1 changes by the difference between the high select voltage 85 and the low select voltage 87, multiplied by (C1/(C1+Cjunction)), where Cjunction is a junction capacitance of the photo-diode D1. After the rapid voltage potential change of the signal node N1, the voltage potential of the signal node N1 continues to decrease after the second event 73 as electrons accumulate on the capacitance of the signal node N1 due to the photo-diode receiving light.

The voltage potential of the signal node N1 will continue to decrease until one of two possible events occur. Either the voltage potential of the SEL input pulses back up to the high select voltage 85, or the voltage potential of the signal node N1 will decrease to the point that the reset transistor M1 begins to conduct. Ramps 91, 93, 95 show several different ramps rates of the voltage potential of the signal node N1. The rate that the voltage potential of the signal node N1 decreases is proportional to the intensity of light received by the photo-diode. The greater the intensity of the light, the faster electrons are collected on the capacitance of the signal node N1 and the faster the voltage potential on the signal node N1 decreases. For example, ramp 91 depicts a faster ramp rate than ramp 95. Therefore, the intensity of light received by photo-diode D1 in generating the ramp 91 is greater than the intensity of light received by the photo-diode D1 in generating the ramp 95.

If the SEL input pulses back up to the high select voltage as depicted by a third event 75, the voltage potential of the signal node N1 will increase by the same amount that the voltage potential of the signal node N1 decreased when the SEL input pulsed to the low select voltage. More precisely, the voltage potential of the signal node N1 increases by the difference between the high select voltage and the low select voltage, multiplied by (C1/(C1+Cjunction)).

The greater the duration of the pulse width of the SEL input, the more likely the signal node N1 will ramp down to a voltage potential where the reset transistor M1 begins to conduct as depicted by ramp 91. Therefore, the pulse width of the SEL input is determined by knowing the intensity the light to be received by the photo-diode D1. Generally, it is desirable to avoid the condition that results when the reset transistor M1 conducts due to the charge conducted by the photo-diode. However, a feature of the invention includes prevention against the occurrence of blooming when this condition occurs. If the reset transistor M1 did not conduct, the voltage potential of the signal node N1 would continue to decrease until the performance of neighboring active pixel sensor would be affected. The reset transistor M1 prevents the active pixel sensor from suffering from blooming.

Several factors can influence the amount that the voltage potential of the signal node N1 can vary during the second event 73. The factors include the threshold voltage of the amplify/compare transistor M2, and the voltage potential of the low reset voltage 81. Increasing the threshold of the amplify/compare transistor M2 will increase the amount the voltage potential of the signal node N1 can vary. Decreasing the voltage potential of the low reset voltage 81 will increase the amount the voltage potential of the signal node N1 can vary.

A third event 75 includes the voltage potential of the SEL input transitioning from the low select voltage to 87 the high select voltage 85. As previously mentioned, the voltage potential of the signal node N1 will increase by the difference between the high select voltage 85 and the low select voltage 87, multiplied by (C1/(C1+Cjunction)). Typical values of the voltage potential of the signal node N1 are depicted as levels 97, 99. This increase in the voltage potential of the signal node N1 will cause the voltage potential at the input of the amplify/compare transistor M2 to be greater than the threshold voltage of the amplify/compare transistor M2. Therefore, the amplify/compare transistor M2 will begin to conduct. As a result, the voltage potential on the signal node N1 is coupled through the amplify/compare transistor M2 to the BUS output. At this point in time, the BUS output is sampled. The sampled output is a representation of the intensity of the light received by the photo-diode D1.

The BUS output can be sampled by an analog to digital converter (ADC) circuit. ADC circuits which are well known may be used. The sampling, however, must occur after the third event 75 and before a fourth event 77 in which the RST of the active pixel sensor transitions from the low reset voltage 81 to the high reset voltage 83.

The term salient integration mode indicates that integration of charge collected by the photo-diode D1 occurs while the signal node N1 is below the threshold voltage of the amplify/compare transistor M2. That is, the integration of the collected charge occurs while the amplify/compare transistor M2 is not conducting.

Figure 8:
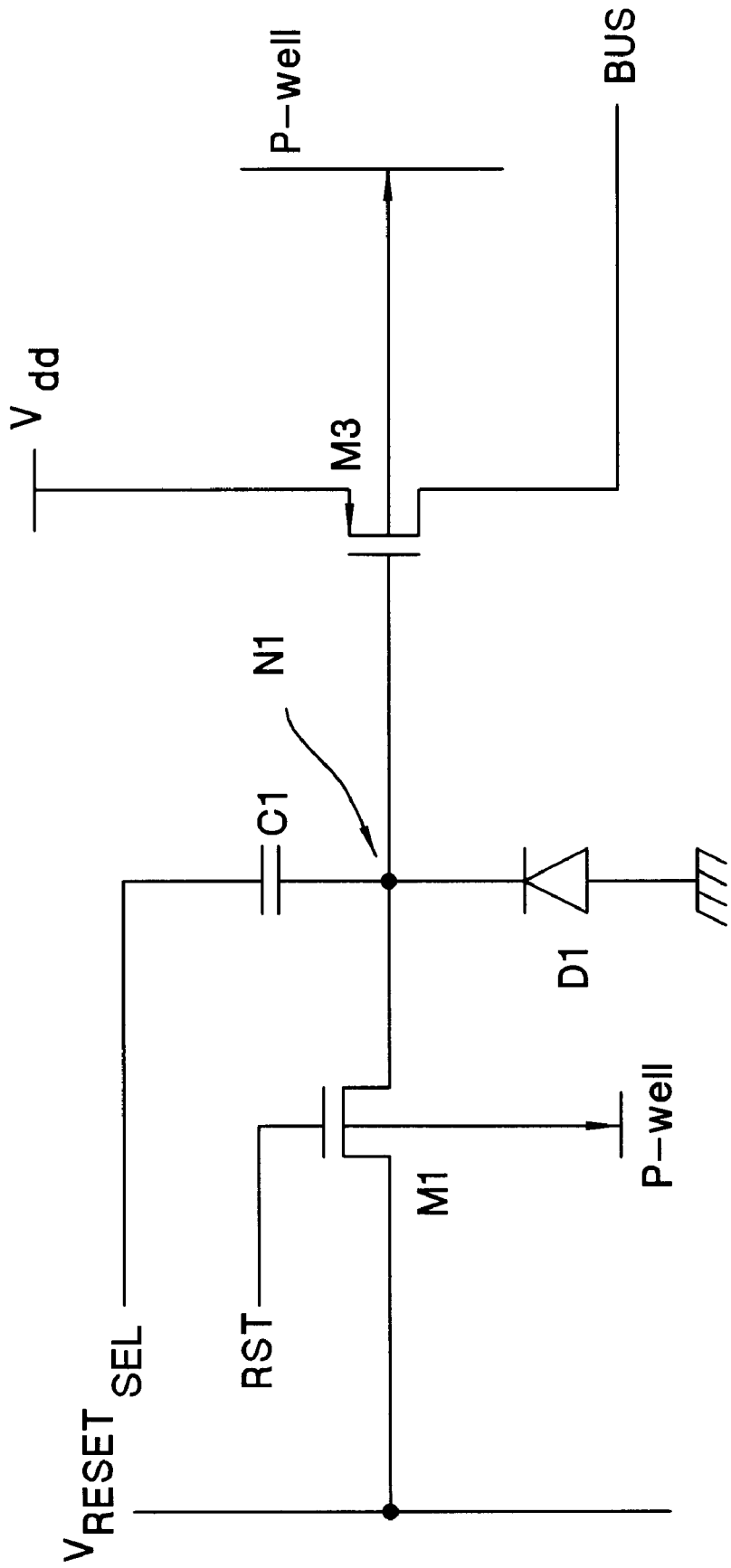
FIG. 8 is a circuit schematic of a second embodiment of the invention.

FIG. 8 is a circuit schematic depicting a second embodiment of the invention. This schematic is very similar to the circuit schematic shown in FIG. 5. However, the N-type MOSFET amplify/compare transistor M2 is replaced with an N-type MOSFET amplify/compare transistor M3 which includes a back gate connected to a P-well. The N-type MOSFET reset transistor M1 is replaced with an N-type MOSFET reset transistor M4 which includes a back gate connected to the P-well. The P-well is connected to an adjustable voltage. Unlike the first embodiment of the invention shown in FIG. 5, the threshold voltage of this embodiment is adjustable. An array of active pixel sensor each according to this embodiment provides for selective adjustment of the threshold voltage of each active pixel sensor individually. The P-well, however, requires a greater amount of integrated circuit substrate area. Therefore, the fill factor for this embodiment is not as great as the first embodiment.

Figure 9:
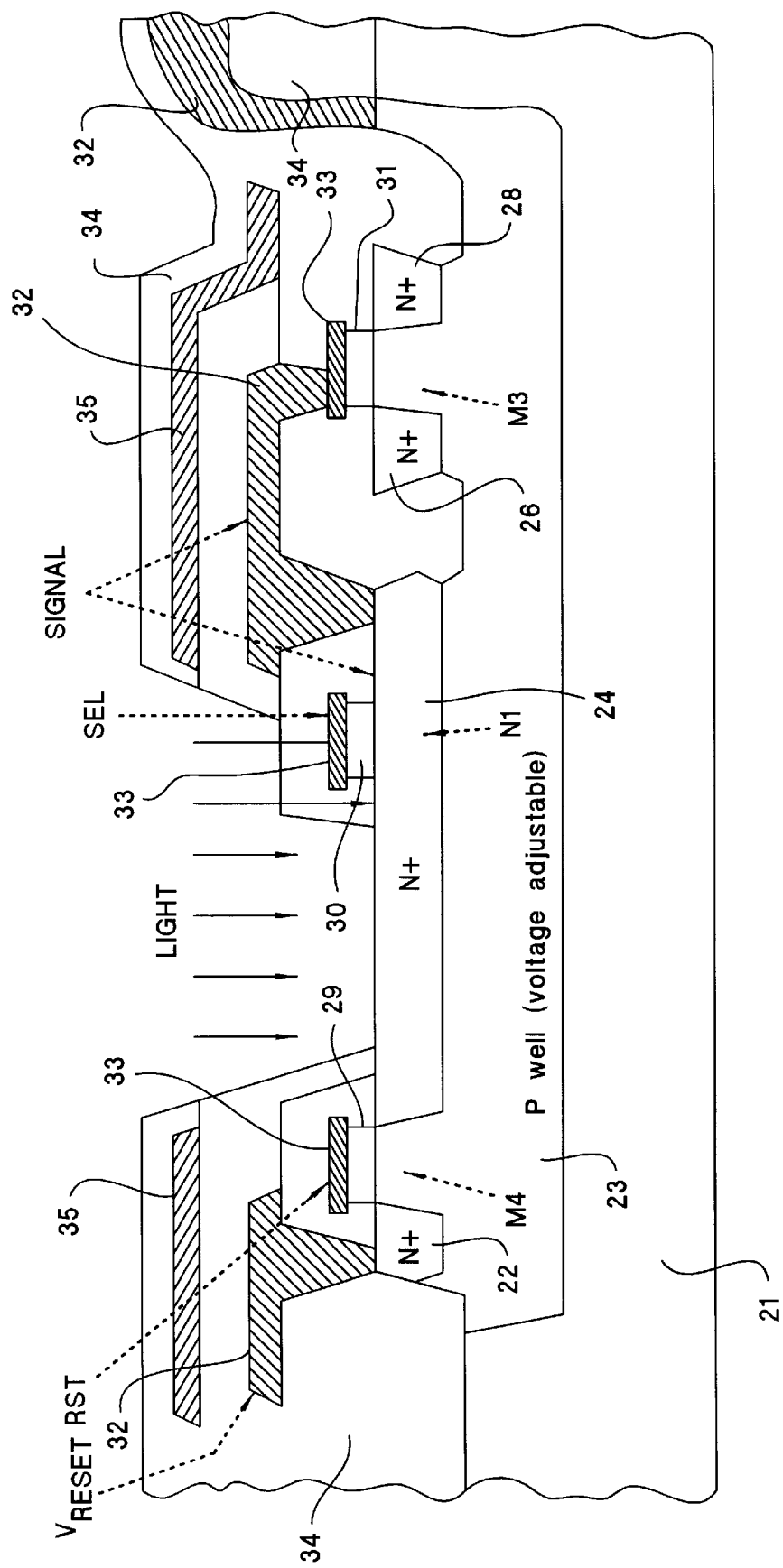
FIG. 9 shows an implementation of the embodiment shown in FIG. 8.

FIG. 9 shows an implementation of the embodiment shown in FIG. 8. This embodiment includes an N-doped substrate 21 and a P-well 23.

The reset transistor M4 is formed by the N-doped diffusion region 22, the gate oxide region 29, the P-well 23 and the N-doped diffusion region 24. The amplify/compare transistor M3 is formed by the N-doped diffusion region 26, the gate region 31, the P-well 23, and the N-doped diffusion region 28. The photo-diode D1 is formed by the P-well 23 and the N-doped diffusion region 24. The coupling capacitor is formed by the gate oxide region 30 and the polysilicon layer 33.

Figure 10:
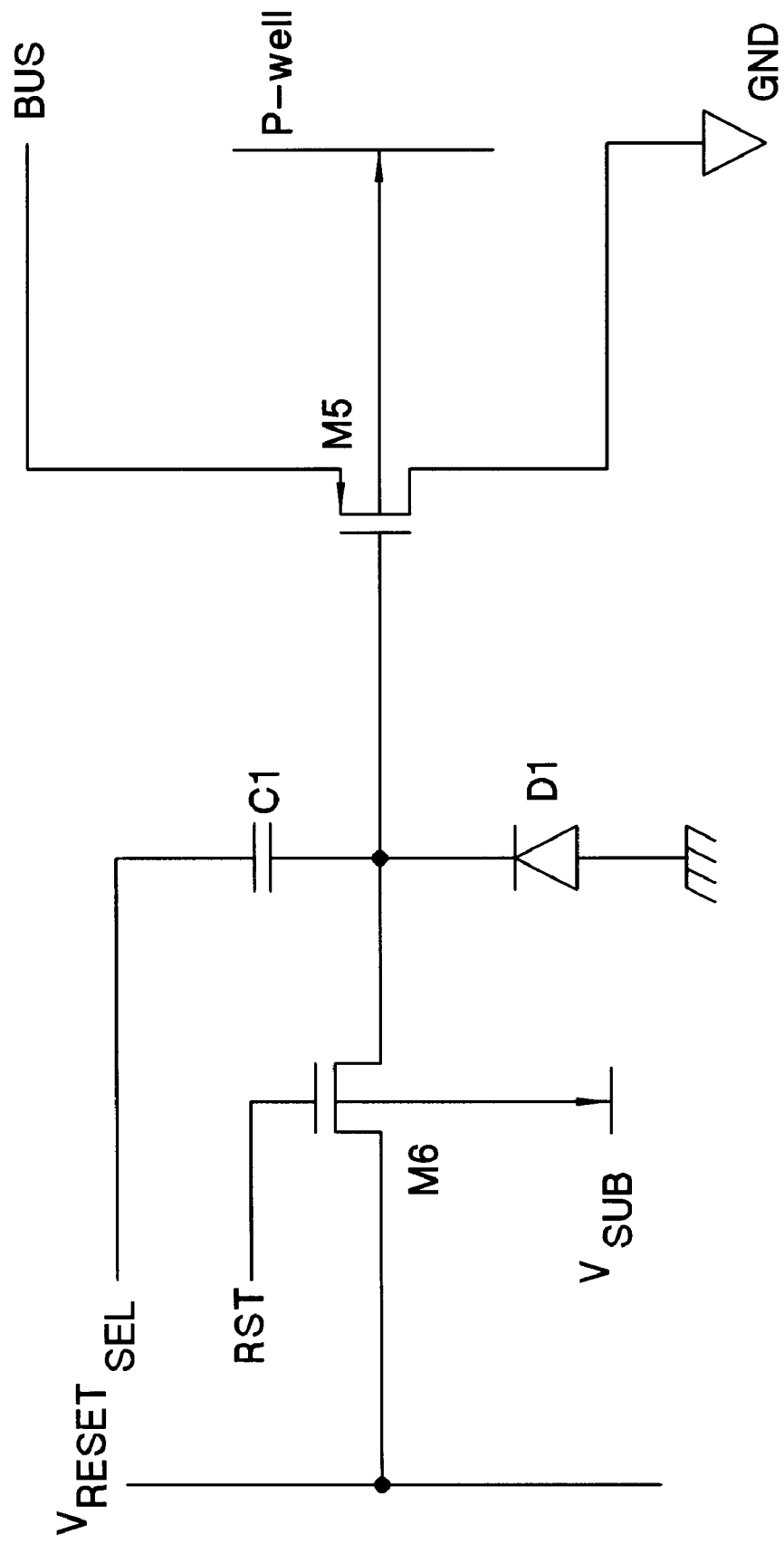
FIG. 10 is a circuit schematic of a third embodiment of the invention.

FIG. 10 is a circuit schematic depicting a third embodiment of the invention. This schematic is very similar to the circuit schematic shown in FIG. 5, but the N-type MOSFET amplify/compare transistor M2 is replaced with a P-type MOSFET amplify/compare transistor M5, and the N-type MOSFET reset transistor M1 is replaced with a P-type MOSFET reset transistor M6. A back gate of the amplify/compare transistor M5 is connected to an N-well. The N-well is connected to an adjustable voltage.

Figure 11:
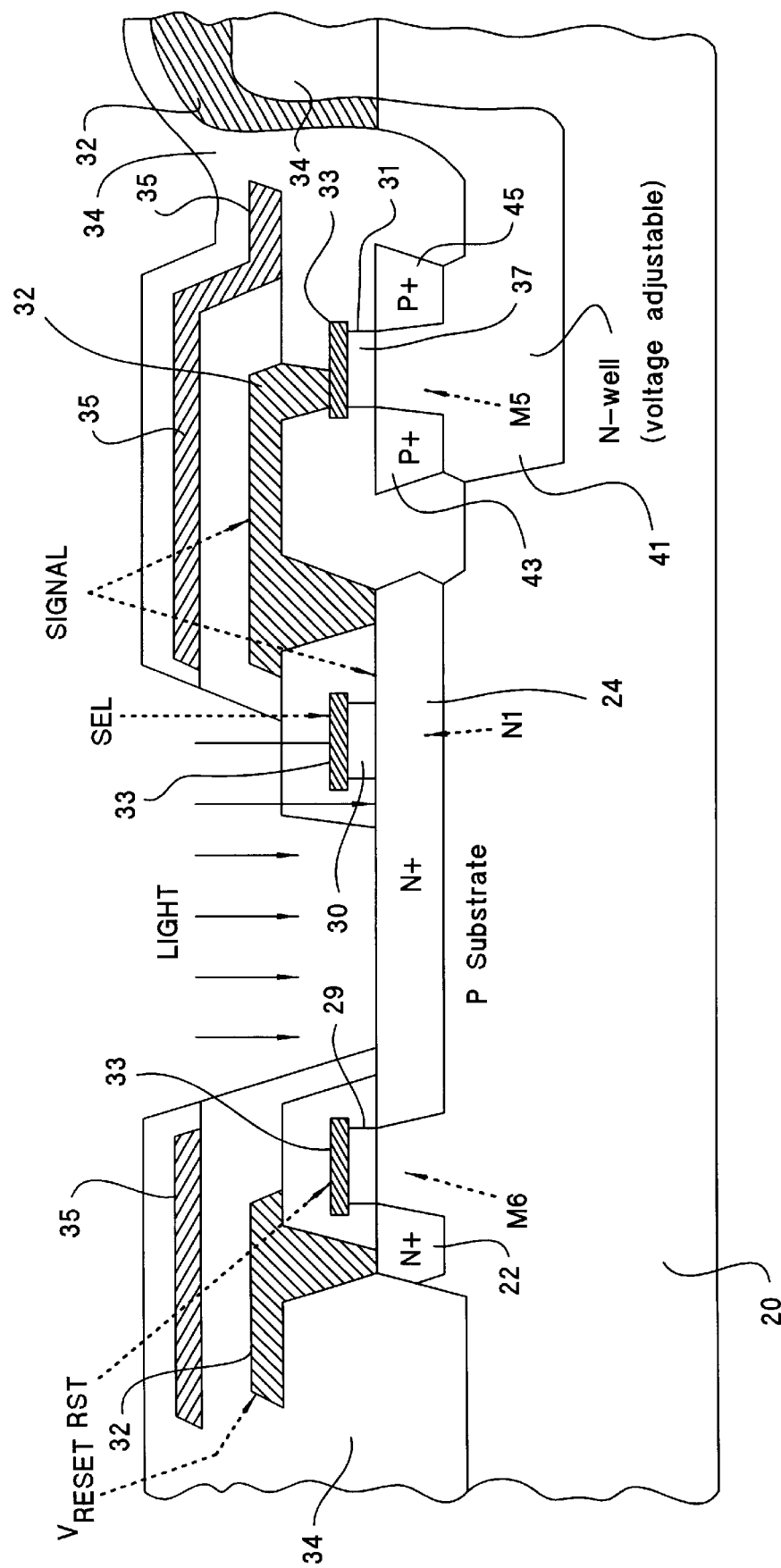
FIG. 11 shows an implementation of the embodiment shown in FIG. 10.

FIG. 11 shows an implementation of the embodiment shown in FIG. 10. This embodiment includes an N-well 41 and P-doped diffusion regions 43, 45.

The reset transistor M6 is formed by the N-doped diffusion region 22, the gate oxide region 29, the P-doped substrate 20 and the N-doped diffusion region 24. The amplify/compare transistor M5 is formed by the P-doped diffusion region 43, the gate region 31, the N-well 41, and the P-doped diffusion region 45. The photo-diode D1 is formed by the P-doped substrate 20 and the N-doped diffusion region 24. The coupling capacitor is formed by the gate oxide region 30 and the polysilicon layer 33.

Figure 12:
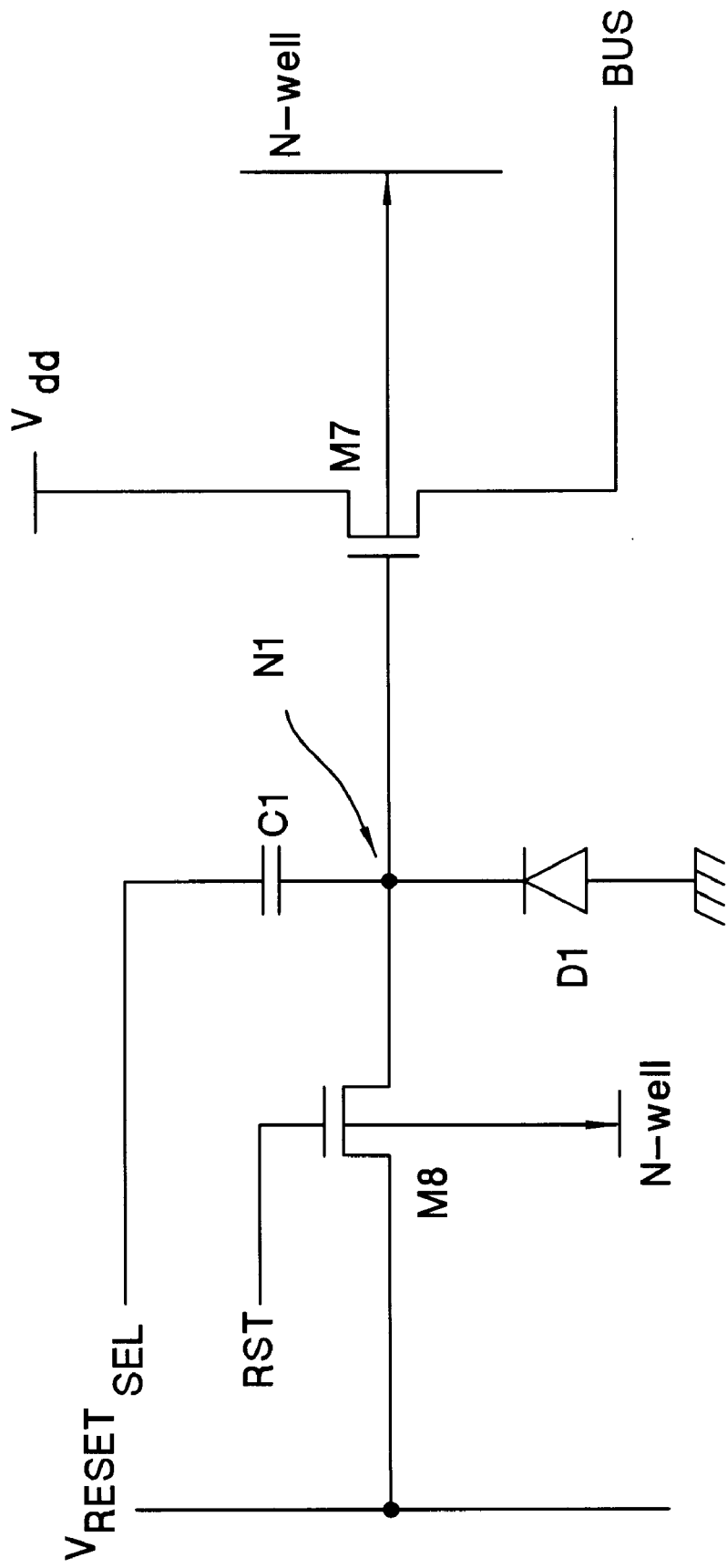
FIG. 12 is a circuit schematic of a fourth embodiment of the invention.

FIG. 12 is a circuit schematic depicting a fourth embodiment of the invention. This embodiment includes a P-type MOSFET amplify/compare transistor M7 and a P-type MOSFET reset transistor M8. A back gate of the amplify/compare transistor M7 is connected to an N-well which is connected to an adjustable voltage. A back gate of the reset transistor M8 is connected to an N-well which is connected to an adjustable voltage.

Figure 13:
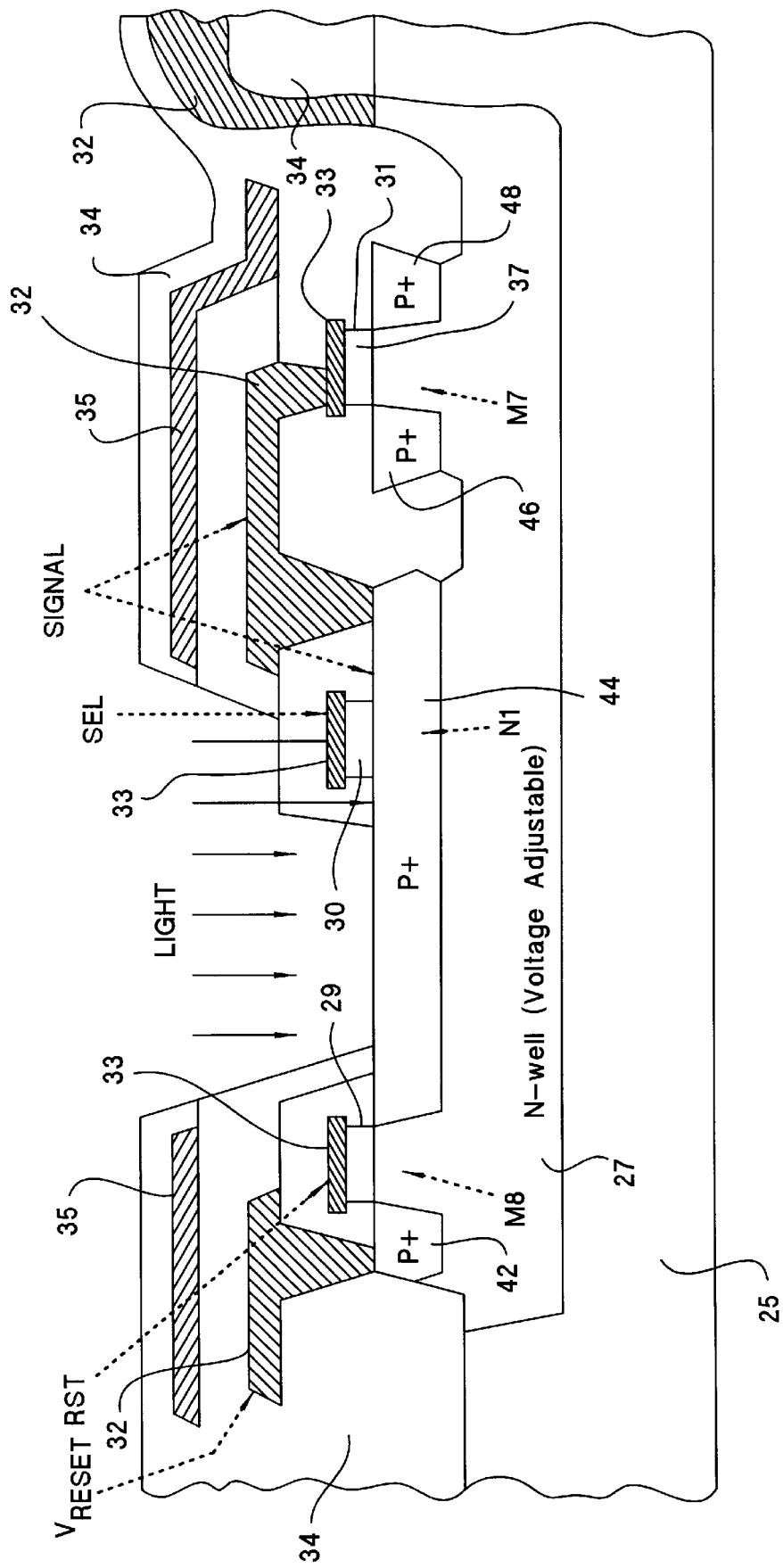
FIG. 13 shows an implementation of the embodiment shown in FIG. 12.

FIG. 13 shows an implementation of the embodiment shown in FIG. 12. This embodiment includes an P-doped substrate 25, an N-well 27 and P-doped diffusion regions 46, 48.

The reset transistor M8 is formed by the P-doped diffusion region 42, the gate oxide region 29, the N-well 27 and the P-doped diffusion region 44. The amplify/compare transistor M7 is formed by the P-doped diffusion region 46, the gate region 31, the N-well 27, and the P-doped diffusion region 48. The photo-diode D1 is formed by the N-well 27 and the P-doped diffusion region 44. The coupling capacitor is formed by the gate oxide region 30 and the polysilicon layer 33.

Figure 14:
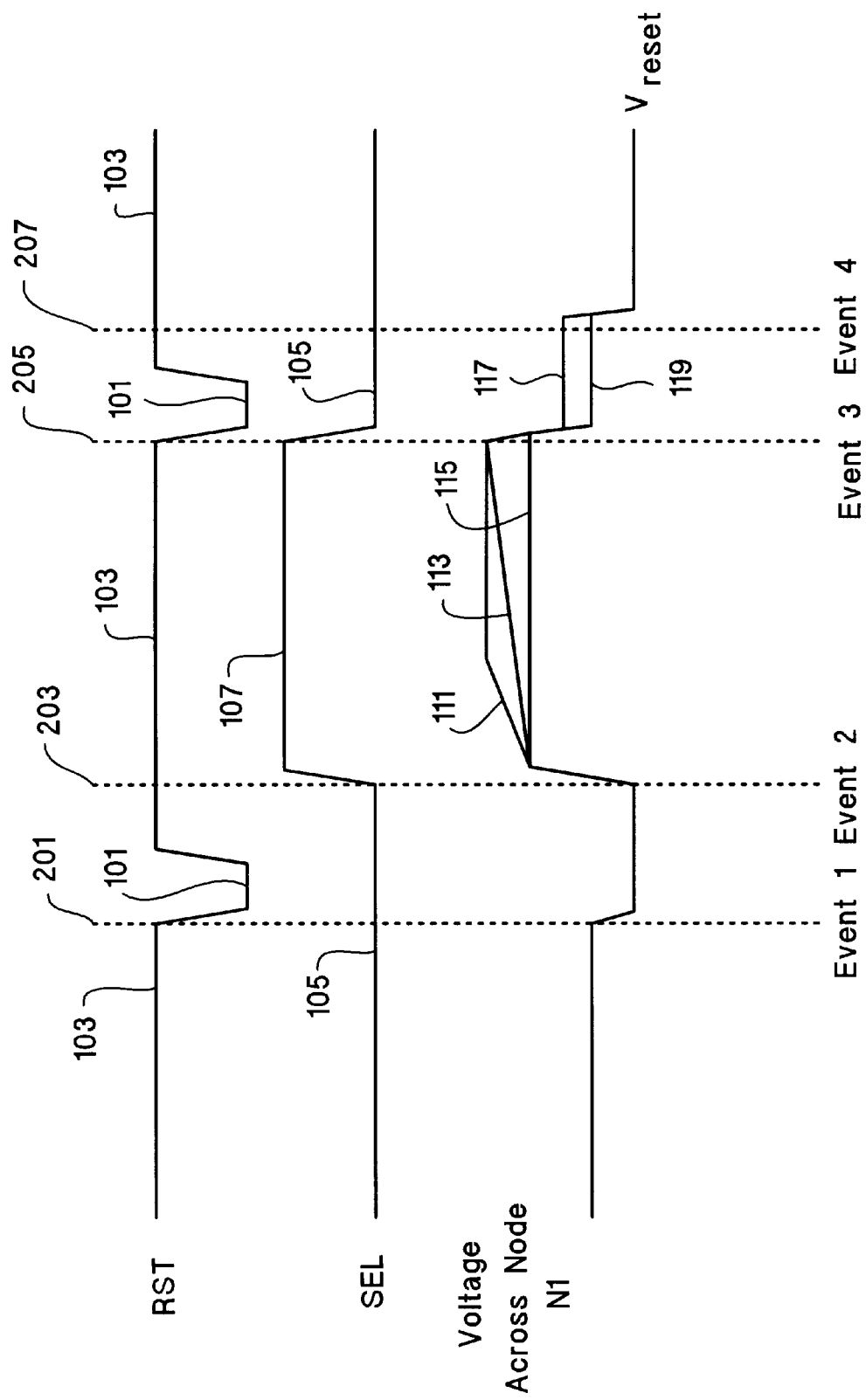
FIG. 14 is a timing diagram of the signals shown in the schematic of FIG. 12 when detecting the intensity of light being received by the active pixel sensor of the invention.

FIG. 14 is a timing diagram of the signals shown in the schematic of FIG. 12 when detecting the intensity of light received by the active pixel sensor of the invention. Detecting the intensity of the light can be sectioned into four major events or steps.

A first event 201 includes the reset line (RST) of the active pixel sensor pulsing from a high reset voltage 103 to a low reset voltage 101. When the reset line (RST) is at the low reset voltage 101, the reset transistor M8 turns on and conducts current. When the reset transistor M8 conducts current, the signal node N1 is pulled down to the voltage potential of the Vreset input. The voltage potential of the Vreset input is adjustable. However, generally Vreset should be set to a voltage potential of greater than the low reset voltage 101 plus the threshold voltage of the reset transistor M8 to reduce the settling time. For example, if the low reset voltage 101 is 0 volts and the threshold of the reset transistor M8 is 0.7 volts, then the voltage potential of the Vreset voltage should be less than 0.7 volts.

A second event 203 includes the voltage potential of the SEL input pulsing from a low select voltage 105 to a high select voltage 107. The RST input is at the high reset voltage 103 for the duration of time the SEL input remains at the high select voltage 107. The SEL input is coupled to the signal node N1 through the coupling capacitor C1. The rapid change in voltage across the coupling capacitor C1 causes charge to collect on the coupling capacitor C1. The voltage potential of the signal node N1 changes by difference between the low select voltage 105 and the high select voltage 107, multiplied by (C1/(C1+Cjunction)), where Cjunction is a junction capacitance of the photo-diode D1. After the rapid voltage potential change of the signal node N1, the voltage potential of the signal node N1 continues to increase after the second event 93 as charge is pulled away from the capacitance of the signal node N1 due to the photo-diode receiving light.

The voltage potential of the signal node N1 will continue to increase until one of two possible events occur. Either the voltage potential of the SEL input pulses back down to the low select voltage 105, or the voltage potential of the signal node N1 will increase to the point that the reset transistor M8 begins to conduct. Ramps 111, 113, 115 show several different ramps rates of the voltage potential of the signal node N1. The rate that the voltage potential of the signal node N1 increases is proportional to the intensity of light received by the photo-diode. The greater the intensity of the light, the faster electrons are pulled away from the capacitance of the signal node N1 and the faster the voltage potential on the signal node N1 increases. For example, ramp 111 depicts a faster ramp rate than ramp 115. Therefore, the intensity of light received by photo-diode D1 in generating the ramp 111 is greater than the intensity of light received by the photo-diode D1 in generating the ramp 115.

If the SEL input pulses back down to the low select voltage 105 as depicted by a third event 205, the voltage potential of the signal node N1 will decrease by the same amount that the voltage potential of the signal node increased when the SEL input pulsed to the high select voltage 107. More precisely, the voltage potential of the signal node N1 decreases by the difference between the low select voltage 105 and the high select voltage 107, multiplied by (C1/(C1+Cjunction)).

The greater the duration of the pulse width of the SEL input, the more likely the signal node N1 will ramp up to a voltage potential where the reset transistor M8 begins to conduct as depicted by ramp 111. Therefore, the pulse width of the SEL input is determined by knowing the intensity the light to be received by the photo-diode D1. Generally, it is desirable to avoid the condition that results when the reset transistor M8 conducts due to the charge conducted by the photo-diode. However, a feature of the invention includes prevention against the occurrence of blooming when this condition occurs. If the reset transistor M8 did not conduct, the voltage potential of the signal node N1 would continue to decrease until the performance of neighboring active pixel sensor would be affected. The reset transistor M8 prevents the active pixel sensor from suffering from blooming.

Several factors can influence the amount that the voltage potential of the signal node N1 can vary during the second event 203. The factors include the threshold voltage of the amplify/compare transistor M7, and the voltage potential of the low reset voltage 101. Increasing the threshold of the amplify/compare transistor M7 will increase the amount the voltage potential of the signal node N1 can vary. Decreasing the voltage potential of the low reset voltage 101 increase the amount the voltage potential of the signal node N1 can vary.

A third event 205 includes the voltage potential of the SEL input transitioning from the high select voltage 107 he low select voltage 105. As previously mentioned, the voltage potential of the signal node N1 will decrease by the difference between the low select voltage 105 and the high select voltage 107, multiplied by (C1/(C1+Cjunction)). Typical values of the voltage potential of the signal node N1 are depicted as levels 117, 119. This decrease in the voltage potential of the signal node N1 will cause the voltage potential at the input of the amplify/compare transistor M7 to be greater than the threshold voltage of the amplify/compare transistor M7. Therefore, the amplify/compare transistor M7 will begin to conduct. As a result, the voltage potential on the signal node N1 is coupled through the amplify/compare transistor M7 to the BUS output. At this point in time, the BUS output is sampled. The sampled output is a representation of the intensity of the light received by the photo-diode D1.

The BUS output can be sampled by an analog to digital converter (ADC) circuit. ADC circuits which are well known may be used. The sampling, however, must occur after the third event 205 and before a fourth event 207 in which the RST of the active pixel sensor transitions from the low reset voltage 101 to the high reset voltage 103.

Figure 15:
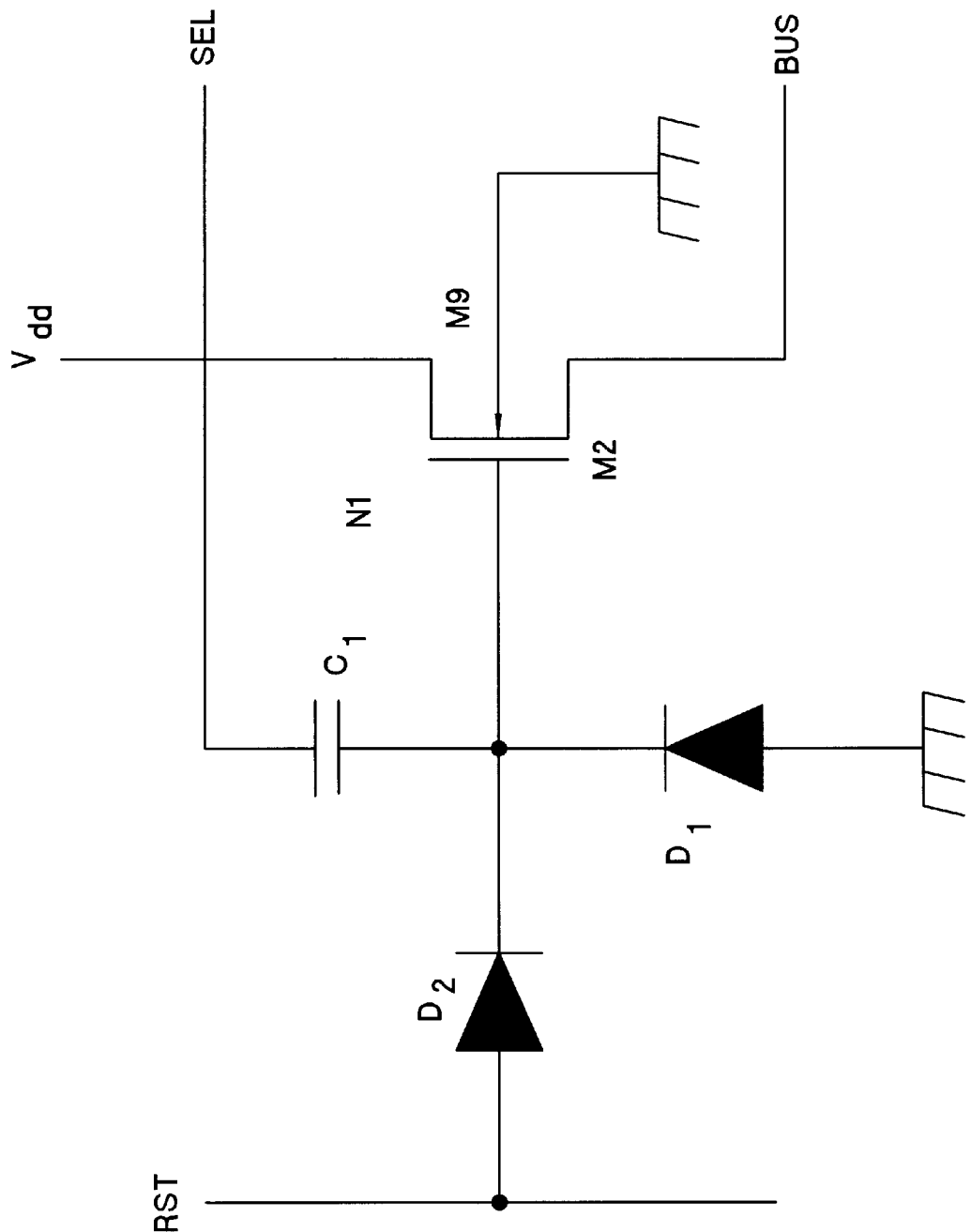
FIG. 15 is a circuit schematic of a fifth embodiment of the invention.

FIG. 15 is a circuit schematic depicting a fifth embodiment of the invention which only requires a single transistor. This embodiment includes a reset diode D2, an N-type MOSFET amplify/compare transistor M9, a coupling capacitor C1 and a photo-diode D1. The amplify/compare transistor M9 includes a channel implant which includes a high substrate impurity concentration which allows for adjustment of the threshold voltage of the amplify/compare transistor M9. The channel implant results in the amplify/compare transistor M9 having a threshold voltage which is higher than a typical N-type MOSFET transistor. The input (gate) of the amplify/compare transistor M9 is connected to the cathode of the photo-diode D1. This connection node is designated as a signal node N1 in FIG. 15.

The RST input resets the active pixel sensor by forward biasing the reset diode D2 and charging or discharging the photo-diode D1. The RST input is biased at a higher voltage potential, such as Vdd, to reset the active pixel sensor. The RST input is biased at a lower voltage potential during the period of time in which electrons are collected on the capacitance of the signal node due to the photo-diode D1 receiving light.

Although specific embodiments of the invention have been described and illustrated, the invention is not to be limited to the specific forms or arrangements of parts so described and illustrated. The invention is limited only by the claims.

What is claimed is:

1. A active pixel sensor comprising:
   a amplify/compare transistor having a controllable threshold voltage, the amplify/compare transistor providing an amplified representation of an input of the amplify/compare transistor to an output of the amplify/compare transistor when the input of the amplify/compare transistor exceeds the threshold voltage;
   a photo-diode, the photo-diode generating a signal voltage which has a voltage level dependent upon the intensity of light which is received by the photo-diode, the signal voltage being coupled to the input of the amplify/compare transistor;
   a reset element, the reset element coupling a reset line to the photo-diode and discharging the photo-diode when the reset line is active; and
   a coupling capacitor for coupling a select line to the input of the amplify/compare transistor, the select line causing the input to the amplify/compare transistor to exceed the threshold voltage and thereby providing an amplified representation of the signal voltage to the output of the amplify/compare transistor.

2. The active pixel sensor as recited in claim 1, wherein the reset element is a reset transistor.

3. The active pixel sensor as recited in claim 1, wherein the reset element is a reset diode.

4. The active pixel sensor as recited in claim 2, wherein the amplify/compare transistor is an N-type MOSFET and the reset transistor is an N-type MOSFET.

5. The active pixel sensor as recited in claim 4, wherein the amplify/compare transistor comprises an implant which determines the threshold voltage.

6. The active pixel sensor as recited in claim 4, wherein the amplify/compare transistor has a threshold voltage which is greater than 0.7 volts and preferably greater than 1.0 volts.

7. The active pixel sensor as recited in claim 4, wherein the amplify/compare transistor has a threshold voltage which is greater than 1.1 volts.

8. The active pixel sensor as recited in claim 4, wherein the amplify/compare transistor comprises a back gate which is connected to a circuit ground.

9. The active pixel sensor as recited in claim 2, wherein the amplify/compare transistor is an P-type MOSFET and the reset transistor is an N-type MOSFET.

10. The active pixel sensor as recited in claim 9, wherein the amplify/compare transistor has a threshold voltage which is adjustable.

11. The active pixel sensor as recited in claim 9, wherein the amplify/compare transistor comprises a back gate which is connected to an adjustable voltage which adjusts the threshold voltage.

12. The active pixel sensor as recited in claim 2, wherein the amplify/compare transistor is an P-type MOSFET and the reset transistor is an P-type MOSFET.

13. The active pixel sensor as recited in claim 12, wherein the amplify/compare transistor has a threshold voltage which is adjustable.

14. The active pixel sensor as recited in claim 12, wherein the amplify/compare transistor comprises a back gate which is connected to an adjustable voltage which adjusts the threshold voltage.

15. The active pixel sensor as recited in claim 2, wherein the reset line is connected to a gate of the reset transistor and the reset line comprises a low voltage level which causes the reset transistor to conduct if the signal voltage drives the input to the amplify/compare transistor to a voltage level of less than the low voltage level minus a reset transistor threshold voltage.

16. The active pixel sensor as recited in claim 2, wherein the reset transistor is connected to a reference voltage and the input to the amplify/compare transistor is driven to a voltage level substantially equal to the reference voltage when the reset line is at an active level.

17. The active pixel sensor as recited in claim 2, wherein the select line comprises a low voltage level and the amplify/compare transistor is not conducting when the select line is at the low voltage level.

* * * * *